(12) United States Patent
Higuchi et al.

(10) Patent No.: US 10,585,169 B2
(45) Date of Patent: Mar. 10, 2020

(54) SIGNAL GENERATING CIRCUIT

(71) Applicant: Mitsubishi Electric Corporation, Chiyoda-ku (JP)

(72) Inventors: Kazuhide Higuchi, Chiyoda-ku (JP); Nobuhiko Ando, Chiyoda-ku (JP); Koji Tsutsumi, Chiyoda-ku (JP); Hiroyuki Mizutani, Chiyoda-ku (JP); Morishige Hieda, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 284 days.

(21) Appl. No.: 15/509,580

(22) PCT Filed: Oct. 3, 2014

(86) PCT No.: PCT/JP2014/005052
§ 371 (c)(1),
(2) Date: Mar. 8, 2017

(87) PCT Pub. No.: WO2016/051438
PCT Pub. Date: Apr. 7, 2016

(65) Prior Publication Data
US 2017/0285139 A1    Oct. 5, 2017

(51) Int. Cl.
*G01S 7/35* (2006.01)
*G01S 13/34* (2006.01)

(52) U.S. Cl.
CPC ............... *G01S 7/35* (2013.01); *G01S 13/34* (2013.01)

(58) Field of Classification Search
CPC ...... G01S 13/34; G01S 13/343; G01S 13/345; G01S 7/35; G01S 7/40; G01S 7/4008;
(Continued)

(56) References Cited

U.S. PATENT DOCUMENTS 4,107,679 A    8/1978 Strauch et al.
5,818,381 A   10/1998 Williams
(Continued)

FOREIGN PATENT DOCUMENTS

CN    102970033 A    3/2013
JP    52-129458 A    10/1977
(Continued)

OTHER PUBLICATIONS

Japanese Office Action dated Apr. 17, 2018 in Japanese Patent Application No. 2016-551121 (with unedited computer generated English translation), 7 pages.
(Continued)

*Primary Examiner* — Timothy X Pham
(74) *Attorney, Agent, or Firm* — Oblon, McClelland, Maier & Neustadt, L.L.P.

(57) ABSTRACT

A signal generating circuit includes a control voltage setting unit (CVSU) configured to set a control voltage for a chirp signal using voltage-frequency characteristics indicating characteristics of an output frequency versus voltage; a VCO configured to alter the frequency of its output signal by the control voltage; a quadrature demodulator configured to perform quadrature demodulation of the output signal of the VCO to generate an inphase signal and a quadrature signal orthogonal to each other; and a frequency detector configured to detect the frequency of the output signal of the VCO on the basis of the inphase signal and quadrature signal. The CVSU corrects the control voltage by using the voltage-frequency characteristics derived from relationships between the control voltage and the frequency of the output signal of the VCO. The VCO generates the chirp signal based on the control voltage corrected by the CVSU.

13 Claims, 7 Drawing Sheets

(58) Field of Classification Search
CPC ........... H03B 23/00; H03L 7/093; H03L 7/18; H03L 7/191; H04B 2001/6912
USPC ........................................................ 342/194
See application file for complete search history.

(56) References Cited

U.S. PATENT DOCUMENTS

| | | | |
|---|---|---|---|
| 6,072,426 | A | 6/2000 | Roos |
| 6,094,158 | A | 7/2000 | Williams |
| 2002/0008585 | A1* | 1/2002 | Welland .................. H03L 7/07 331/2 |
| 2005/0040900 | A1 | 2/2005 | Bostak et al. |
| 2005/0179582 | A1* | 8/2005 | Woodington ...... B60K 31/0008 342/70 |
| 2009/0033538 | A1 | 2/2009 | Winkler |
| 2009/0224963 | A1* | 9/2009 | Nakanishi ............. G01S 7/4008 342/200 |
| 2010/0262021 | A1 | 10/2010 | Yadav et al. |
| 2011/0018597 | A1* | 1/2011 | Lee ........................ H03L 7/085 327/156 |
| 2013/0050013 | A1 | 2/2013 | Kobayashi et al. |
| 2015/0070204 | A1* | 3/2015 | Shirakawa .............. G01S 7/354 342/90 |
| 2017/0285135 | A1* | 10/2017 | Valentine ................ G01S 7/022 |

FOREIGN PATENT DOCUMENTS

| | | | |
|---|---|---|---|
| JP | 61-95602 | A | 5/1986 |
| JP | 4-54463 | A | 2/1992 |
| JP | 5-41258 | B2 | 6/1993 |
| JP | 7-44446 | B2 | 5/1995 |
| JP | 11-251900 | A | 9/1999 |
| JP | 2001-53820 | A | 2/2001 |
| JP | 2005-70044 | A | 3/2005 |
| JP | 2007-124438 | A | 5/2007 |
| JP | 3153816 | U | 8/2009 |
| JP | 4407769 | B2 | 2/2010 |
| JP | 2011-12984 | A | 1/2011 |
| JP | 2011-247598 | A | 12/2011 |
| JP | 2013-47617 | A | 3/2013 |
| JP | 2014-62824 | A | 4/2014 |
| WO | WO 2014/107203 | A2 | 7/2014 |

OTHER PUBLICATIONS

International Search Report dated Jan. 6, 2015, in PCT/JP2014/005052, filed Oct. 3, 2014.
Extended European Search Report dated May 7, 2018 in European Patent Application No. 14903322.7, 54 pages.
Japanese Office Action dated Oct. 24, 2017 in Japanese Patent Application No. 2016-551121 (with unedited computer generated English translation).
Office Action dated Nov. 29, 2018 in Chinese Patent Application No. 201480082366.6 with unedited computer generated English translation.
Combined Chinese Office Action and Search Report dated Aug. 21, 2019 in corresponding Chinese Patent Application No. 201480082366.6 (with an English Translation), 25 pages.

* cited by examiner

SIGNAL GENERATING CIRCUIT

TECHNICAL FIELD

The present invention relates to a signal generating circuit for generating a chirp signal.

BACKGROUND ART

An FMCW (Frequency Modulated Continuous Waves) radar, which is capable of simultaneously measuring the distance and relative speed between the radar and a target object at high accuracy is widely used as an onboard radar. The system transmits a chirp signal as a continuous wave, receives a reflected wave from the target object, and measures the distance to the target object from the delay time of the reflected wave and the speed relative to the target object from a frequency shift. Here, the chirp signal refers to a signal subjected to the frequency modulation which varies the frequency with time.

As a signal generating circuit in an FMCW radar device, for example, a signal generating circuit of a Patent Literature 1 is known. The signal generating circuit of the Patent Literature 1 comprises a modulation controller, a digital to analog converter (DAC), a low pass filter (LPF), a voltage controlled oscillator (VCO), a local signal generator, a difference frequency signal generator, an IF detector and an ADC (Analog to Digital Converter). The modulation controller comprises a lookup table (LUT) that records voltage-frequency characteristics (V-F characteristics) of the VCO.

Next, the operation of the signal generating circuit at the time of generating the chirp signal will be described. The modulation controller obtains from the V-F characteristics of the LUT a control voltage that will linearize the time-frequency characteristics of the chirp signal, and outputs the control voltage to the DAC as a digital signal.

The DAC converts the digital control voltage fed from the modulation controller into an analog control voltage, and outputs the analog control voltage to the LPF.

The LPF eliminates a high-frequency component of the control voltage fed from the DAC, and smoothes the control voltage. Then the LPF outputs the control voltage to the VCO.

The VCO, on the basis of the V-F characteristics it possesses, outputs a signal with the frequency corresponding to the control voltage in accordance with the control voltage fed from the LPF.

As a result, the signal generating circuit generates the control voltage of the VCO on the basis of the V-F characteristics of the VCO, which the LUT possesses, and can generate the chirp signal subjected to the frequency modulation.

Next, the operation of the signal generating circuit at the time of updating the LUT will be described.

The VCO generates the chirp signal (f1) in accordance with the control voltage.

The local signal generator generates the local signal (f2).

The difference frequency signal generator outputs the IF (Intermediate Frequency) signal (f1−f2), which is a difference frequency component between the output signal of the VCO and the local signal, from the output signal (f1) of the VCO and the local signal (f2) generated by the local signal generator.

The IF detector outputs the IF detection signal to the ADC when the frequency of the IF signal becomes not greater than a specified IF detection frequency. That the frequency of the IF signal becomes not greater than the specified IF detection frequency occurs when f1 is nearly equal to f2. Since the frequency f1 varies with time, the timing at which f1 is nearly equal to f2 occurs.

The ADC measures the control voltage (v1) of the VCO at the timing when the IF detector outputs the IF detection signal, and outputs it to the modulation controller. This operation is carried out several times while varying the local frequency f2.

From the variation of the control voltage v1 while varying the local frequency f2, the modulation controller obtains the V-F characteristics of the VCO, and updates the V-F characteristics stored in the LUT. On the basis of the updated V-F characteristics, the modulation controller obtains the control voltage that will linearize the time-frequency characteristics of the chirp signal, and outputs the control voltage to the DAC as the digital signal.

Thus, the signal generating circuit of Patent Literature 1 updates the V-F characteristics stored in the LUT using the local signal generator, difference frequency signal generator, and IF detector, and generates the chirp signal on the basis of the updated V-F characteristics.

However, the circuit of Patent Literature 1 cannot compensate for the error of the chirp signal when the V-F characteristics of the VCO suddenly vary owing to the disturbance of the temperature or the like. The circuit must generate the chirp signal a plurality of times while varying the local frequency f2 to obtain the V-F characteristics of the VCO, and cannot update the V-F characteristics of the VCO during that time. In other words, since the circuit of Patent Literature 1 can detect from a single chirp signal only one voltage value (V) and only one frequency value (F) corresponding to the voltage, it cannot obtain the V-F characteristics of the VCO unless it generates the chirp signal a plurality of times.

CITATION LIST

Patent Literature

Patent Literature 1: Japanese Patent Application Publication No. 2011-247598.

SUMMARY OF INVENTION

Technical Problem

The conventional signal generating circuit has a problem of being unable to compensate for the error of the chirp signal when the V-F characteristics of the VCO suddenly vary owing to disturbance.

Solution to Problem

In accordance with the present invention, there is provided a signal generating circuit which includes: a control voltage setting unit configured to set a control voltage by using voltage-frequency characteristics indicating characteristics of an output frequency versus voltage; a voltage controlled oscillator configured to alter a frequency of an output signal in response to the control voltage; a quadrature demodulator configured to carry out quadrature demodulation of part of the output signal of the voltage controlled oscillator using a local signal generated by a local oscillator, to generate an inphase signal and a quadrature signal which are orthogonal to each other; and a frequency detector configured to detect the frequency of the output signal of the voltage controlled oscillator on the basis of the inphase signal and the quadrature signal. The control voltage setting unit corrects the control voltage by using the voltage-frequency characteristics derived from relationships between the control voltage and the frequency of the output signal of the voltage controlled oscillator. The voltage controlled oscillator generates a chirp signal on the basis of the control voltage corrected by the control voltage setting unit.

Advantageous Effects of Invention

The signal generating circuit in accordance with the present invention is configured in such a manner as to generate the inphase signal and the quadrature signal which are orthogonal to each other, by carrying out the quadrature demodulation of part of the output signal of the VCO using a local signal generated by a local oscillator, and to detect the frequency of the output signal of the VCO on the basis of the inphase signal and the quadrature signal, thereby deriving the V-F characteristics of the VCO. Accordingly, the signal generating circuit in accordance with the present invention is capable of compensating for the error of the chirp signal even if the V-F characteristics of the VCO change suddenly owing to disturbance.

DESCRIPTION OF EMBODIMENTS

Embodiment 1

Figure 1:
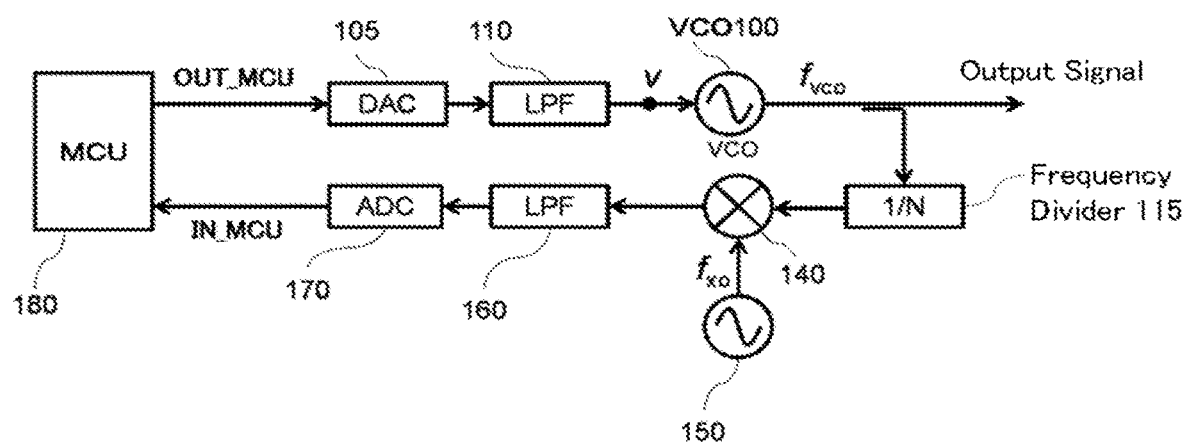
FIG. 1 is a block diagram showing a configuration of a signal generating circuit of an embodiment 1.

FIG. 1 is a block diagram showing a configuration of a signal generating circuit of an embodiment 1.

The signal generating circuit comprises a VCO (Voltage Controlled Oscillator) 100, a DAC (Digital to Analog Converter) 105, an LPF (Low Pass Filter) 110, a frequency divider 115, a multiplier 140, a local oscillator 150, an LPF 160, an ADC (Analog to Digital Converter) 170, and an MCU (Micro Controller Unit) 180. In FIG. 1, v designates the control voltage of the VCO 100, fvco designates the frequency of the output signal (output frequency) of the VCO 100, and fxo designates the output frequency of the local oscillator 150. In addition, IN_MCU designates an input signal to the MCU, and OUT_MCU designates the output signal from the MCU.

The VCO 100 is a voltage controlled oscillator that outputs a signal with the frequency corresponding to the control signal output from the LPF 110. For example, as the VCO 100, an oscillator circuit is employed which is comprised of an active circuit with transistors and a tuned circuit based on a varactor diode.

The DAC 105 is a circuit that converts the digital control signal output from a control voltage setting unit 130 into an analog control signal and outputs it. For example, as the DAC 105, a $\Delta\Sigma$-type DAC is employed which is comprised of a $\Delta\Sigma$ modulator and a comparator.

The LPF 110 is a low pass filter that smoothes the analog control signal output from the DAC 105 by removing the high-frequency component of the analog control signal, and outputs the smoothed analog control signal to the VCO 100. For example, as the LPF 110, a filter circuit is employed which is comprised of a coil and a capacitor.

The frequency divider 115 is a frequency divider that divides the frequency of the output signal of the VCO 100 by a division ratio N (N is a natural number), and outputs the signal obtained by the frequency division. For example, as the frequency divider 115, a counter circuit is employed which is comprised of a flip-flop.

The multiplier 140 is a multiplier that multiplies the signal output from the frequency divider 115 and the signal output from the local oscillator 150 which will be described later, and outputs the resultant signal. For example, the multiplier 140 is employed which is comprised of a frequency mixer composed of a diode and a transformer.

The local oscillator 150 is a signal source that outputs to the multiplier 140 a reference signal for carrying out the frequency conversion. The local oscillator 150 is comprised of a crystal oscillator with accurate oscillation frequency. As the local oscillator 150, a DDS (Direct Digital Synthesizer) can be employed as well.

The LPF 160 is a filter that removes the high-frequency component from the signal output from the multiplier 140, and outputs the signal whose high-frequency component is removed. For example, as the LPF, a filter circuit is employed which is comprised of a coil and a capacitor.

The ADC 170 is a circuit that converts the analog signal output from the LPF 160 into a digital signal, and outputs the digital signal to the MCU 180.

Figure 2:
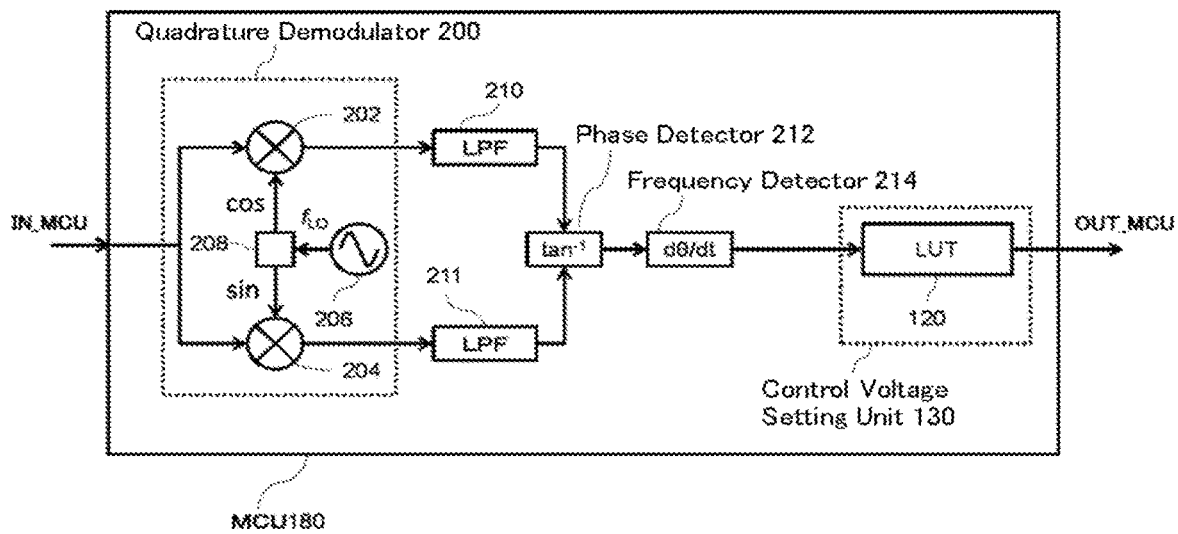
FIG. 2 is a block diagram showing a configuration of the MCU 180 of Embodiment 1.

FIG. 2 is a block diagram showing a configuration of the MCU 180 of the signal generating circuit of Embodiment 1. The MCU 180 is an integrated circuit (microcontroller unit) into which a computer system is incorporated. The microcontroller unit includes a CPU (Central Processing Unit), a memory, an input/output circuit, and a timer circuit. The MCU 180 comprises a control voltage setting unit 130, a quadrature demodulator 200, an LPF 210, an LPF 211, a phase detector 212, and a frequency detector 214. These components may be comprised of software operating on the MCU 180, or comprised of an analog circuit or a digital circuit.

The quadrature demodulator 200 is a circuit that carries out quadrature demodulation of the digital signal output from the ADC 170, and generates an inphase signal and a quadrature signal orthogonal to each other. The quadrature demodulator 200 comprises a multiplier 202, a multiplier 204, a 90-degree phase shift distributor 208, and a local oscillator 206.

The local oscillator 206 is an oscillator that outputs a signal of a fixed frequency.

The 90-degree phase shift distributor 208 is a phase shift distributor that divides the output signal of the local oscillator 206 into two signals of a cosine wave and a sine wave with phases different by 90 degrees.

The multiplier 202 is a multiplier that multiplies the output signal of the ADC 170 by the cosine wave, and outputs the resultant signal as the inphase signal.

The multiplier 204 is a multiplier that multiplies the output signal of the ADC 170 by the sine wave, and outputs the resultant signal as the quadrature signal.

The LPF 210 is a low pass filter that removes the high-frequency component of the output signal of the multiplier 202, and outputs the signal whose high-frequency component is eliminated.

The LPF 211 is a low pass filter that removes the high-frequency component of the output signal of the multiplier 204, and outputs the signal whose high-frequency component is eliminated.

The phase detector 212 is a circuit for detecting the instantaneous phase from the output signal of the LPF 210 and the output signal of the LPF 211, which are orthogonal to each other. The instantaneous phase refers to the phase of the signal at each time when the phase of the signal varies with time (when the phase is a function of time).

The frequency detector 214 is a circuit for carrying out the time derivative of the instantaneous phase output from the phase detector 212 so as to detect the instantaneous frequency. The instantaneous frequency is defined as the rate of change of the phase of the signal with respect to time in the signal whose frequency varies with time, and refers to the frequency with respect to each time.

The control voltage setting unit 130 is a circuit which comprises the LUT (Look Up Table) 120 storing the V-F characteristics of the VCO 100, and generates the control signal of the VCO 100 on the basis of the V-F characteristics stored in the LUT 120. For example, the control voltage setting unit 130 is comprised of the memory of the MCU 180 and the input/output circuit of the MCU 180. Incidentally, although the control voltage setting unit 130 comprises the internal LUT 120 here, the control voltage setting unit 130 can have any configuration as long as it can set the control signal of the VCO 100 by referring to the LUT 120. For example, the control voltage setting unit 130 may be configured in such a manner as to comprise the LUT 120 outside, and to generate the control voltage by referring to the external LUT 120.

Figure 3:
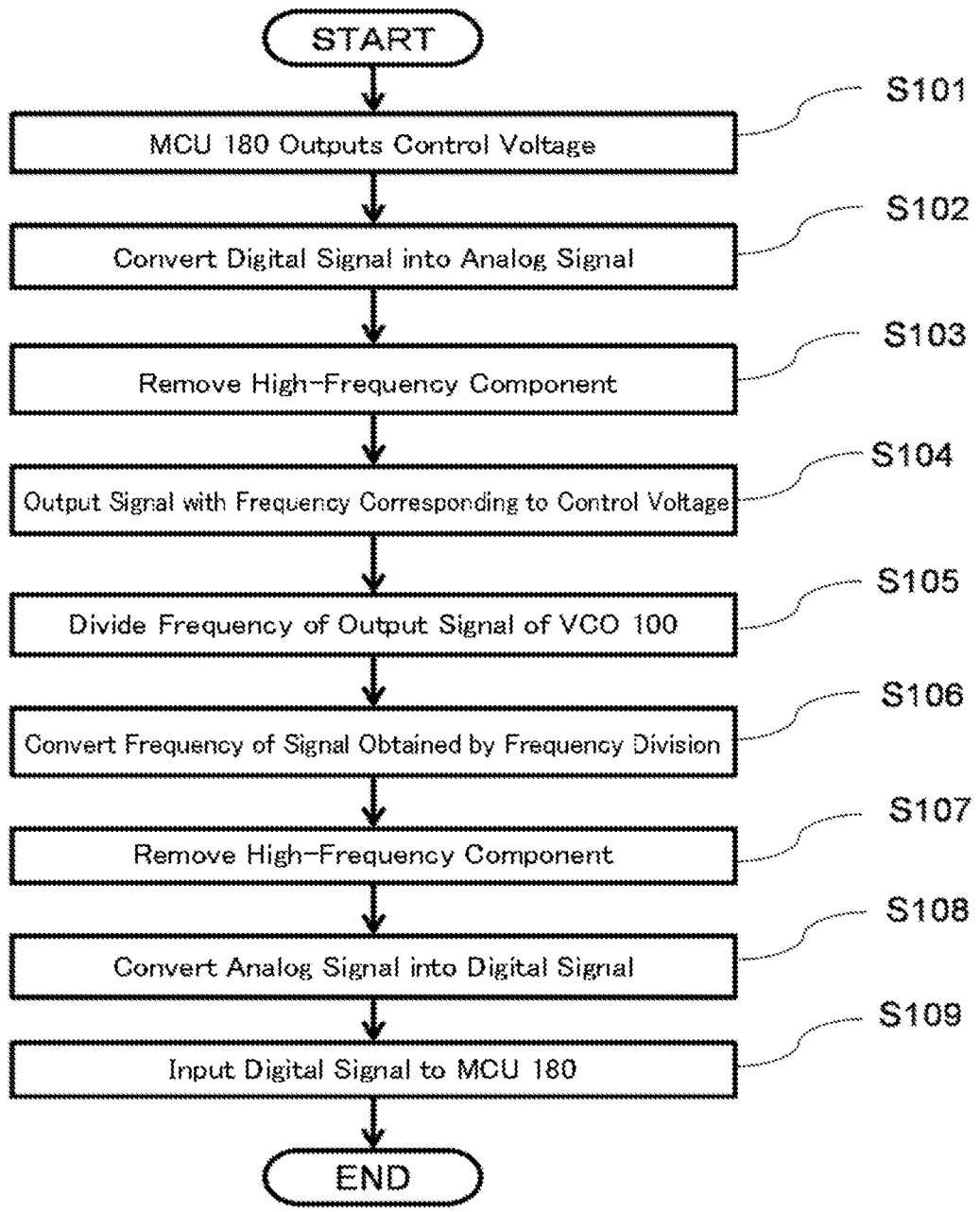
FIG. 3 is a flowchart showing the operation of the signal generating circuit of Embodiment 1.

Next, the operation of the signal generating circuit when generating a chirp signal will be described. FIG. 3 is a flowchart showing the operation of the signal generating circuit of Embodiment 1. Referring to FIG. 3, the operation of the signal generating circuit will be described.

The control voltage setting unit 130 of the MCU 180 generates the control voltage of the VCO 100 for each time on the basis of the V-F characteristics of the VCO 100 stored in the LUT 120, and outputs the control voltage to the DAC 105 (S101).

The DAC 105 converts the control voltage output from the control voltage setting unit 130 from the digital signal into the analog signal, and outputs the analog signal to the LPF 110 (S102).

The LPF 110 smoothes the output signal of the DAC 105 by removing the high-frequency component from the signal, and outputs the smoothed signal to the VCO 100 (S103).

On the basis of the V-F characteristics, the VCO 100 outputs the signal ($\cos(2\pi f_{vco}t)$) with the frequency corresponding to the control signal output from the LPF 110 (S104). Here, $f_{vco}$ designates the frequency of the output signal of the VCO 100.

The frequency divider 115 divides the frequency of a part of the signal output from the VCO 100 by the division ratio N (N is a natural number), and outputs the frequency-divided signal ($\cos(2\pi f_{vco}/N)t$)) to the multiplier 140 (S105). Here, $f_{vco}/N$ designates the frequency of the output signal of the frequency divider 115.

The multiplier 140 multiplies the signal ($\cos((2\pi f_{xo})t)$) the local oscillator 150 outputs and the output signal ($\cos(2\pi f_{vco}/N)t$)) of the frequency divider 115, and outputs the signal undergoing the frequency conversion by the multiplication (S106). Here, $f_{xo}$ designates the frequency of the output signal of the local oscillator 150.

In this way, using the signal obtained by the frequency divider 115 and the output signal of the local oscillator 150, the multiplier 140 converts the frequency of the output signal of the VCO 100 into the frequency the ADC 170 can capture, which will be described later.

By the way, when carrying out the frequency conversion, the multiplier 140 can convert the frequency of the output signal of the VCO 100 as it is without using the frequency-divided signal. In this case, a PLL (Phase Locked Loop) circuit becomes necessary as the local oscillator 150. This will increase the size of the circuit, and hence the configuration using the frequency divider 115 and multiplier 140 is preferable.

The output signal (S) of the multiplier 140 is given by the following Expression (1).

[Expression 1]

$$S = \cos((2\pi f_{vco}/N)t) * \cos((2\pi f_{xo})t) \qquad (1)$$
$$= 0.5\{\cos(2\pi(f_{vco}/N - f_{xo})t) + \cos(2\pi(f_{vco}/N + f_{xo})t)\}$$

The LPF 160 removes the high-frequency component of the output signal of the multiplier 140, and outputs the difference frequency signal which is the first term of Expression (1) (S107). The difference frequency signal (Sdiff) is given by the following Expression (2).

[Expression 2]

$$S\text{diff} = \cos(2\pi(f_{vco}/N - f_{xo})t) \qquad (2)$$

Here, to simplify the Expression, the coefficient 0.5 is omitted.

The ADC 170 converts the output signal of the LPF 160 from the analog signal into a digital signal (S108), and outputs the digital signal to the quadrature demodulator 200 of the MCU 180 (S109).

Figure 4:
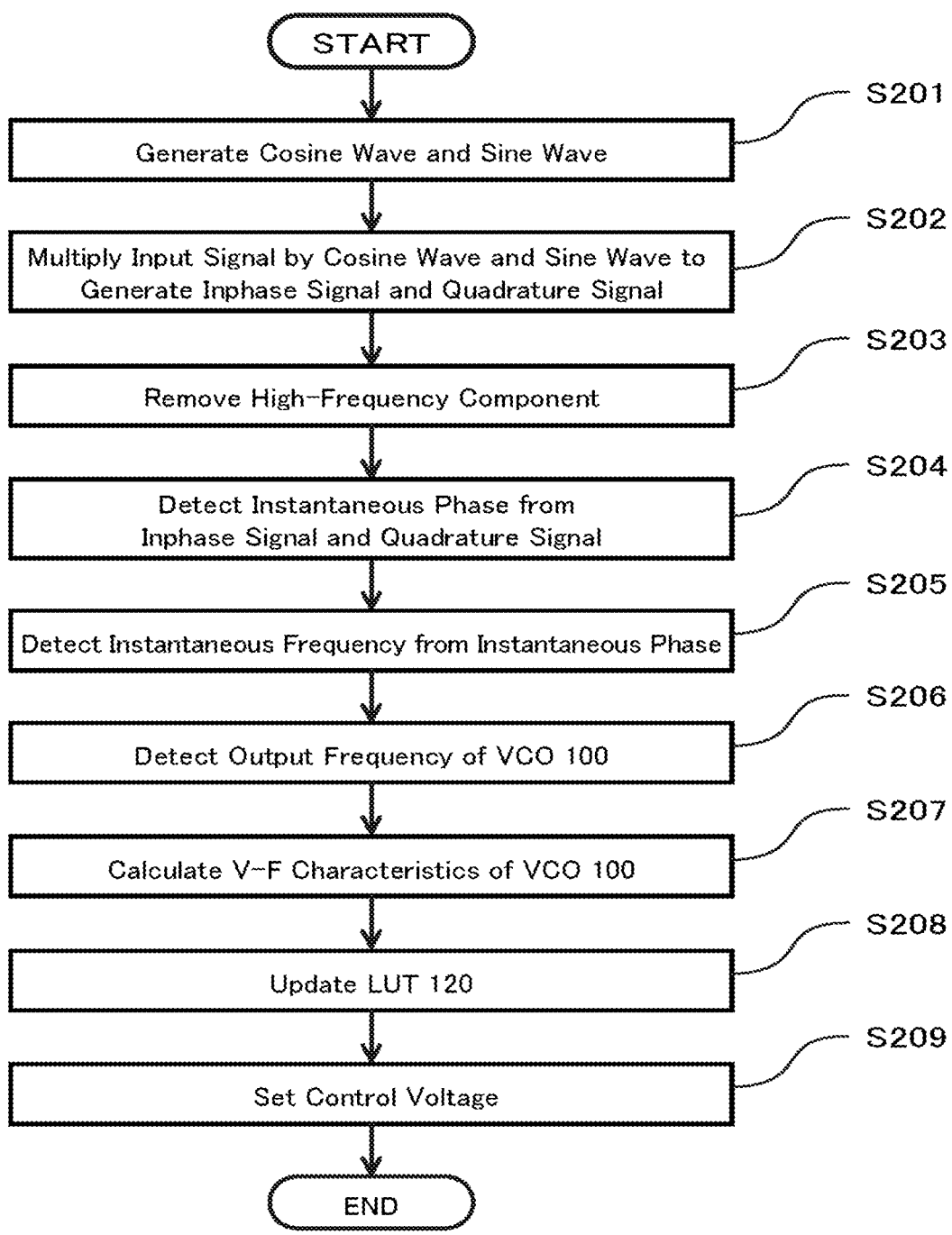
FIG. 4 is a flowchart showing the operation of the MCU 180 of Embodiment 1.

FIG. 4 is a flowchart showing the operation of the MCU 180. Referring to FIG. 4, the operation of the MCU 180 will be described.

The local oscillator 206 outputs the local signal whose frequency is $f_{LO}$ to the 90-degree phase shift distributor 208, and the 90-degree phase shift distributor 208 distributes the local signal to the two signals with the 90-degree phase difference, and generates the cosine wave ($\cos(2\pi f_{LO}t)$) and the sine wave ($\sin(2\pi f_{LO}t)$) (S201).

The multiplier 202 multiplies the cosine wave ($\cos(2Pf_{LO}t)$) and the output signal (Sdiff) of the ADC 170, and outputs the resultant signal to the LPF 210 as the inphase signal (S202). The signal output from the multiplier 202 is given by the following Expression (3).

[Expression 3]

$$Si = \cos((2\pi f_{vco}/N - f_{xo})t) * \cos((2\pi f_{LO})t) \quad (3)$$
$$= 0.5\{\cos(2\pi(f_{vco}/N - f_{xo} - f_{LO})t) + \cos(2\pi(f_{vco}/N - f_{xo} + f_{LO})t)\}$$

The multiplier 204 multiplies the sine wave ($\sin(2\pi f_{LO}t)$) and the output signal of the ADC 170 (Sdiff), and outputs the resultant signal to the LPF 211 as the quadrature signal. The signal output from the multiplier 204 is given by the following Expression (4).

[Expression 4]

$$Sq = \cos((2\pi f_{vco}/N - f_{xo})t) * \sin((2\pi f_{LO})t) \quad (4)$$
$$= 0.5\{-\sin(2\pi(f_{vco}/N - f_{xo} - f_{LO})t) + \sin(2\pi(f_{vco}/N - f_{xo} + f_{LO})t)\}$$

The LPF 210 removes the high-frequency component from the inphase signal Si, and outputs the inphase signal Si whose high-frequency component is removed to the phase detector 212 (S203). The LPF 211 removes the high-frequency component from the quadrature signal Sq, and outputs the quadrature signal Sq whose high-frequency component is removed to the phase detector 212. The signals Si and Sq whose high-frequency components are removed are given by the following Expression (5) and Expression (6), respectively.

[Expression 5]

$$Si = 0.5 \cos(2\pi(f_{vco}/N - f_{xo} - f_{LO})t) \quad (5)$$

[Expression 6]

$$Sq = -0.5 \sin(2\pi(f_{vco}/N - f_{xo} - f_{LO})t) \quad (6)$$

Here, Si designates the inphase signal (I signal) and Sq designates the quadrature signal (Q signal).

The phase detector 212 divides the quadrature signal output from the LPF 211 by the inphase signal output from the LPF 210, multiplies the division result by −1, and calculates the arctangent thereof. Thus, the phase detector 212 detects the instantaneous phase (S204).

The instantaneous phase ($\theta(t)$) is given by the following Expression (7).

[Expression 7]

$$\theta(t) = \arctan(-Sq/Si) = 2\pi(f_{vco}/N - f_{xo} - f_{LO})t \quad (7)$$

The frequency detector 214 calculates the time derivative of the instantaneous phase, and detects the instantaneous frequency (S205). The instantaneous frequency (fbb) is given by the following Expression (8).

[Expression 8]

$$f_{bb} = (d\theta(t)/dt)/2\pi = f_{vco}/N - f_{xo} - f_{LO} \quad (8)$$

Here, N is the division ratio, $f_{xo}$ is the frequency of the output signal of the local oscillator 150, and $f_{LO}$ is the frequency of the output signal of the local oscillator 206. Since $f_{bb}$, N, $f_{xo}$, and $f_{LO}$ are known, the frequency detector 214 can detect the output frequency ($f_{vco}$) of the VCO 100 (S206). The frequency of the output signal of the VCO 100 is given by the following Expression (9).

[Expression 9]

$$f_{vco} = (f_{bb} + f_{LO} + f_{xo}) * N \quad (9)$$

Since the frequency detector 214 can detect the instantaneous frequency ($f_{bb}$) for each time, it can detect the output frequency ($f_{vco}$) of the VCO 100 for each time by Expression (9). Thus, the frequency detector 214 can detect the time variations of the output frequency ($f_{vco}$) of the VCO 100 from a single chirp signal. Thus, the frequency detector 214 can detect the time-frequency characteristics of the VCO 100. This means that the frequency detector 214 can obtain the V-F characteristics of the VCO 100 from a single chirp signal.

The control voltage setting unit 130 obtains the V-F characteristics of the VCO 100 from the time variations of the control voltage output to the DAC 105 and from the time-frequency characteristics detected by the frequency detector 214 (S207). After that, the control voltage setting unit 130 updates the V-F characteristics stored in the LUT 120 to the V-F characteristics obtained at step S207 (S208).

Next, on the basis of the V-F characteristics updated, the control voltage setting unit 130 corrects the control voltage of the VCO 100, and outputs the corrected control voltage to the DAC 105 (S209). Here, while the VCO 100 is outputting the chirp signal, the control voltage setting unit 130 can determine the control voltage of the next chirp signal. This is because since the frequency detector 214 can detect the instantaneous frequency from the instantaneous phase, the control voltage setting unit 130 can successively update the LUT 120 for each time.

The DAC 105 converts the digital control voltage output from the control voltage setting unit 130 of the MCU 180 into the analog control voltage, and outputs to the LPF 110. The LPF 110 smoothes the control voltage output from the DAC 105 by removing the high-frequency component from the control voltage. Then, the LPF 110 outputs the smoothed control voltage to the VCO 100.

The VCO 100 generates the chirp signal in response to the control voltage output from the LPF 110. Here, since the control voltage is corrected on the basis of the updated V-F characteristics, the VCO 100 can generate the chirp signal at high linearity.

Figure 5:
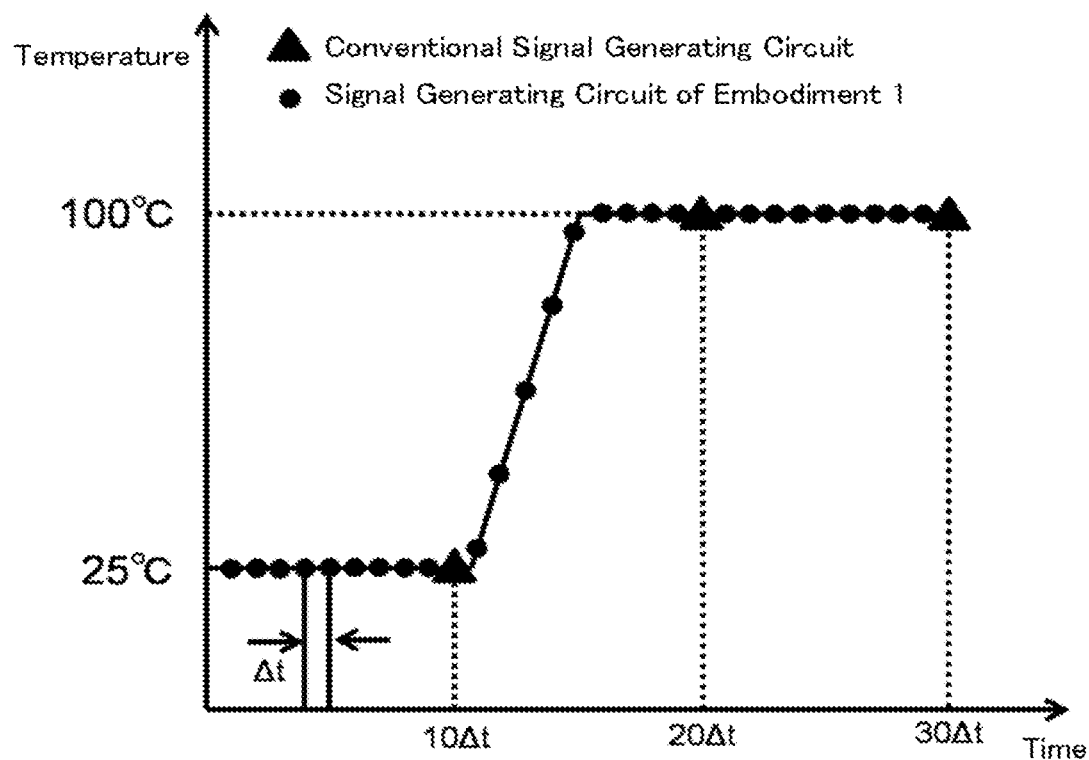
FIG. 5 is a diagram showing update timings of V-F characteristics in the signal generating circuit of Embodiment 1 and in the signal generating circuit of the prior art (invention of Patent Literature 1)

FIG. 5 is a diagram showing the update timing of the V-F characteristics in the signal generating circuit of Embodiment 1 and in the signal generating circuit of the prior art (the invention in Patent Literature 1). Referring to FIG. 5, an effect of the signal generating circuit of Embodiment 1 will be described. In FIG. 5, the vertical axis shows the temperature of the signal generating circuit, and the horizontal axis shows the time. In FIG. 5, closed triangles show timings at which the signal generating circuit of the prior art updates the V-F characteristics, and closed circles show timings at which the signal generating circuit of Embodiment 1 updates the V-F characteristics. In addition, as shown in FIG. 5, since a sudden change occurs in the signal generating circuit from 10Δt to 20Δt, the V-F characteristics of the VCO 100 also change sharply during that time. Incidentally, the following description will be made on the assumption that both the signal generating circuit of Embodiment 1 and the signal generating circuit of the prior art generate the chirp signal at every Δt interval.

Here, as already described, the signal generating circuit of the prior art must generate the chirp signal a plurality of times to obtain the V-F characteristics. It is assumed here that the V-F characteristics are calculated from ten chirp signals. Then, since the chirp signal is generated at every Δt interval, the V-F characteristics are updated at every 10Δt.

Thus, the signal generating circuit of the prior art must generate 10 chirp signals to obtain the V-F characteristics. Accordingly, from Δ10t to Δ20t in FIG. 5 during which the temperature changes sharply, it cannot update the V-F characteristics, thereby being unable to compensate for the error of the chirp signal.

In contrast with this, the signal generating circuit of Embodiment 1 can calculate the V-F characteristics from a single chirp signal as described before. Thus, it can update the V-F characteristics at every Δt interval as shown in FIG. 5, thereby being able to compensate for the error of the chirp signal even while the temperature is varying (during the time from Δ10t to Δ20t in FIG. 5).

Figure 6:
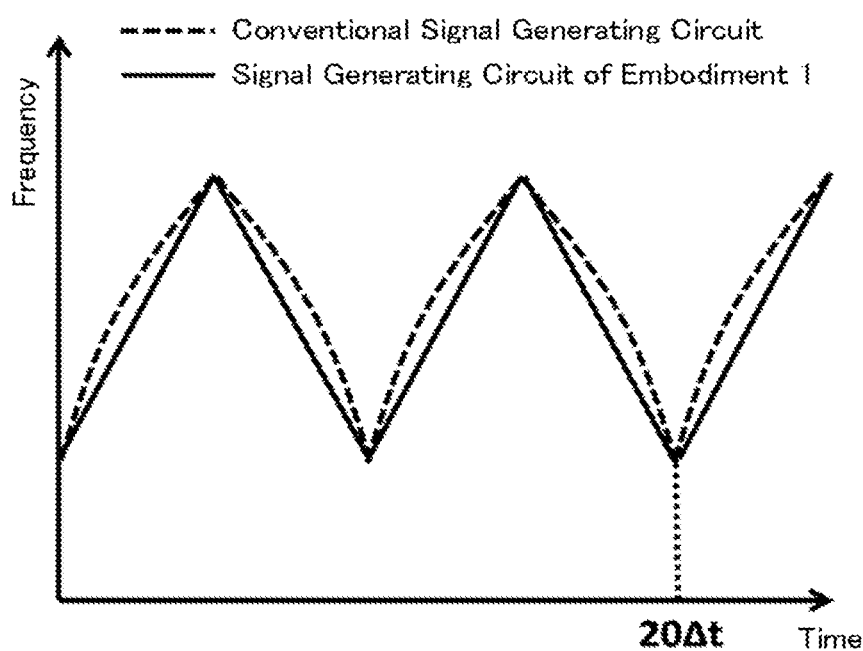
FIG. 6 is a diagram showing a chirp signal generated by the signal generating circuit of Embodiment 1.

FIG. 6 is a diagram showing the chirp signal generated by the signal generating circuit of Embodiment 1, in which the vertical axis shows the frequency, and the horizontal axis shows the time. Solid lines denote the chirp signal generated by the signal generating circuit of Embodiment 1, and broken lines denote the chirp signal generated by the signal generating circuit of the prior art. It is found that the chirp signal indicated by the solid lines has higher linearity than that indicated by the broken lines.

Incidentally, although an example is shown here in which the temperature varies as the disturbance, a signal generating circuit in accordance with the present invention can compensate for the error of the chirp signal even when the V-F characteristics of the VCO 100 varies owing to electromagnetic waves emitted from other equipment or owing to degradation over time of the VCO 100.

As described above, according to Embodiment 1, it is configured in such a manner as to carry out the quadrature demodulation of the output signal of the VCO 100 to generate the inphase signal and the quadrature signal orthogonal to each other; to detect the frequency of the output signal of the VCO 100 on the basis of the inphase signal and the quadrature signal; and to derive the V-F characteristics of the VCO 100. Accordingly, even when the V-F characteristics of the VCO 100 change suddenly owing to the disturbance, the signal generating circuit in accordance with the present invention can derive the V-F characteristics of the VCO 100 every time the chirp signal is output, and can compensate for the error of the chirp signal.

In addition, according to Embodiment 1, it is configured in such a manner as to update the V-F characteristics stored in the LUT 120 using the output signal of the VCO 100. Accordingly, Embodiment 1 can compensate for the error of the chirp signal without stopping the output of the chirp signal.

Furthermore, according to Embodiment 1, it is configured by employing the MCU 180 in such a manner as to integrally construct the quadrature demodulator 200, LPF 210, LPF 211, phase detector 212, frequency detector 214 and control voltage setting unit 130 as software on the MCU 180. This makes it possible to reduce the size of the signal generating circuit.

Incidentally, although an example is shown here in which the quadrature demodulator 200, LPF 210, LPF 211, phase detector 212, frequency detector 214 and control voltage setting unit 130 are integrally arranged on the MCU 180, a configuration is also possible which employs discrete digital circuits or analog circuits.

In addition, the quadrature demodulator 200, LPF 210, LPF 211, phase detector 212, frequency detector 214 and control voltage setting unit 130 can be formed by an FPGA (Field Programmable Gate Array).

Although the signal generating circuit of Embodiment 1 is configured in such a manner as to convert the frequency of the output signal of the frequency divider 115 using the multiplier 140 and the local oscillator 150, and to output the frequency converted signal to the ADC 170, a configuration is also possible from which the multiplier 140 and local oscillator 150 are removed, when the frequency divider 115 can convert the frequency down to the frequency the ADC 170 is able to capture.

Although the control voltage setting unit 130 is configured in such a manner as to set the control voltage using the LUT 120, a configuration is also possible which sets the control voltage without using the LUT 120. Thus, a configuration is also possible which does not store the V-F characteristics as a table, but obtains the V-F characteristics through computing processing at the time of setting the control voltage, and sets the control voltage.

Embodiment 2

In Embodiment 1, the configuration is shown which removes the high-frequency components (unnecessary wave components) from the signals output from the quadrature demodulator 200 by using the LPF 210 and LPF 211, and extracts the difference frequency components (desired wave components). In Embodiment 2, a configuration will be shown which extracts the desired wave component without using the LPF 210 or LPF 211.

Figure 7:
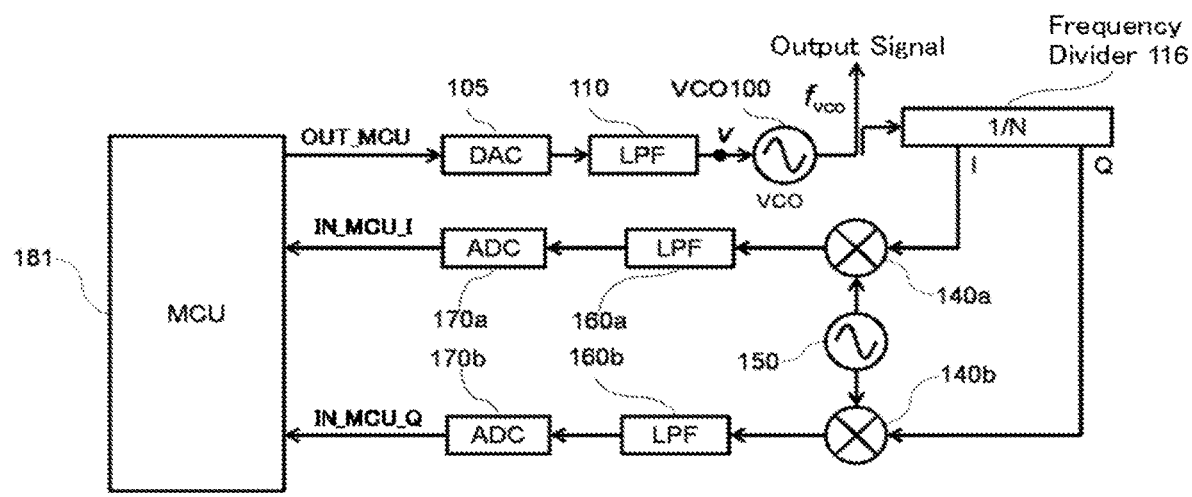
FIG. 7 is a block diagram showing a configuration of a signal generating circuit of an embodiment 2.

FIG. 7 is a block diagram showing a configuration of the signal generating circuit of Embodiment 2.

Incidentally, in FIG. 7, the same reference numerals as those of FIG. 1 designate the same or like components and their description will be omitted. In FIG. 7, I designates the inphase signal output from the frequency divider 116, and Q designates the quadrature signal output from the frequency divider 116. In addition, IN_MCU_I designates the inphase signal input to the MCU 181, IN_MCU_Q designates the quadrature signal input to the MCU 181, and OUT_MCU designates the signal output from the MCU 181.

As compared with the configuration of Embodiment 1, the signal generating circuit of Embodiment 2 differs in that it comprises a frequency divider 116 for outputting the inphase signal and the quadrature signal instead of the frequency divider 115, a multiplier 140a and a multiplier 140b instead of the multiplier 140, an LPF 160a and an LPF 160b instead of the LPF 160, an ADC 170a and an ADC 170b instead of the ADC 170, and an MCU 181 instead of the MCU 180.

The multiplier 140a and multiplier 140b are the same as the multiplier 140. The LPF 160a and LPF 160b are the same as the LPF 160. The ADC 170a and ADC 170b are the same as the ADC 170.

The frequency divider 116 is a frequency divider that divides the frequency of the output signal of the VCO 100, and outputs the frequency-divided signal as the inphase signal and quadrature signal. In other words, the frequency divider 116 is an oscillator with a quadrature demodulation function.

Figure 8:
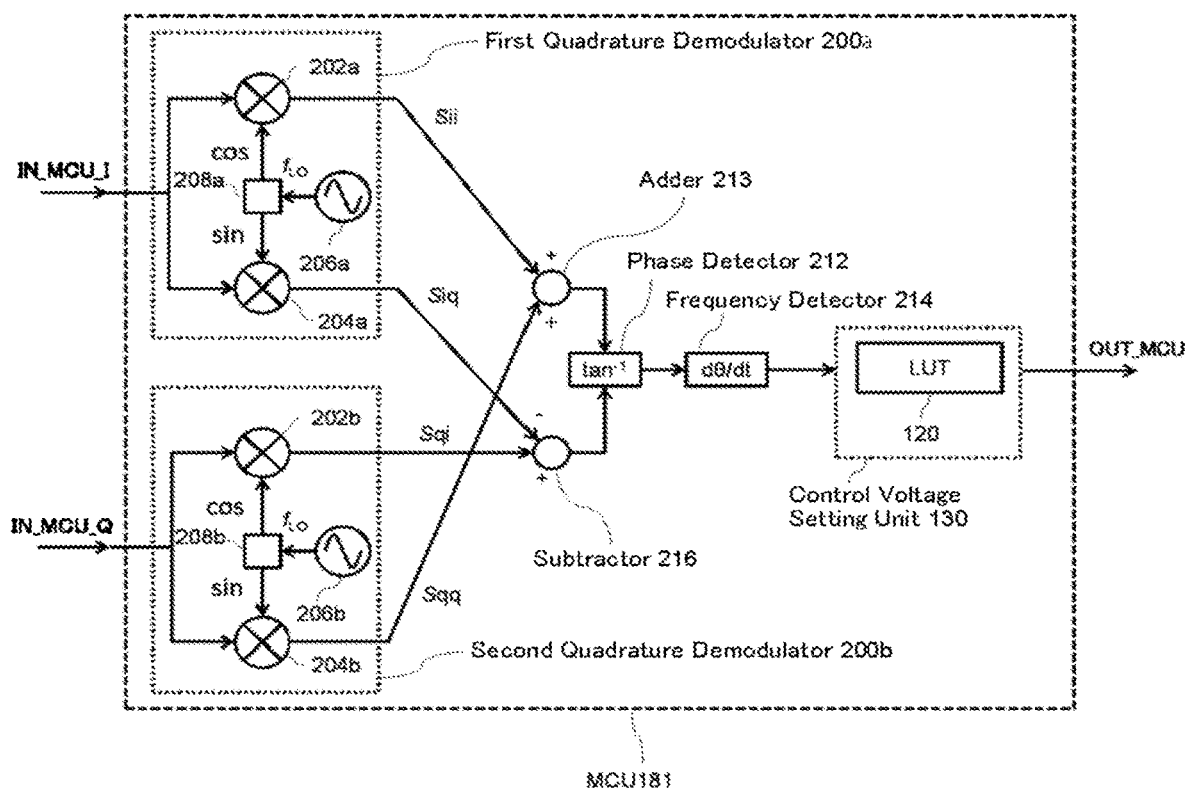
FIG. 8 is a block diagram showing a configuration of the MCU 181 of Embodiment 2.

FIG. 8 is a block diagram showing a configuration of the MCU 181 of the signal generating circuit of Embodiment 2.

As compared with the configuration of Embodiment 1, the MCU 181 of Embodiment 2 differs in that it comprises a first quadrature demodulator 200a and a second quadrature demodulator 200b instead of the quadrature demodulator 200, comprises an additional adder 213 and subtractor 216, and omits the LPF 210 and LPF 211.

The first quadrature demodulator 200a and second quadrature demodulator 200b are the same as the quadrature demodulator 200.

The adder 213 is a circuit for adding two signals. The function of the adder 213 is implemented by software processing of the MCU 181. Incidentally, the adder 213 may be comprised of an analog circuit or digital circuit.

The subtractor 216 is a circuit for subtracting one signal from another signal. The function of the subtractor 216 is implemented by software processing of the MCU 181. Incidentally, the subtractor 216 may be comprised of an analog circuit or digital circuit.

Next, the operation of the signal generating circuit of Embodiment 2 will be described.

Since the operations of the DAC 105, LPF 110, VCO 100 and local oscillator 150 are the same as those of Embodiment 1, their description will be omitted.

The frequency divider 116 divides the frequency of the output signal of the VCO 100, and outputs the frequency-divided signal as the inphase signal and the quadrature signal orthogonal to each other.

The multiplier 140a multiplies the frequency-divided signal by the frequency divider 116 and the output signal of the local oscillator 150, and outputs the signal whose frequency is converted by the multiplication. The multiplier 140b multiplies the frequency-divided signal by the frequency divider 116 and the output signal of the local oscillator 150, and outputs the signal whose frequency is converted by the multiplication.

The LPF 160a removes the high-frequency component of the output signal of the multiplier 140a. The LPF 160b removes the high-frequency component of the output signal of the multiplier 140b.

The ADC 170a converts the output signal of the LPF 160a from the analog signal into the digital signal, and outputs the digital signal to the first quadrature demodulator 200a of the MCU 181. The ADC 170b converts the output signal of the LPF 160b from the analog signal into the digital signal, and outputs the digital signal to the second quadrature demodulator 200b of the MCU 181.

The signal (IN_MCU_I) output from the ADC 170a is given by the following Expression (10).

[Expression 10]

$$Si = \cos(2\pi(f_{vco}/N - f_{xo})t) \quad (10)$$

The signal (IN_MCU_Q) output from the ADC 170b is given by the following Expression (11).

[Expression 11]

$$Sq = \sin(2\pi(f_{vco}/N - f_{xo})t) \quad (11)$$

The local oscillator 206a outputs the local signal whose frequency is $f_{LO}$ to the 90-degree phase shift distributor 208a. The 90-degree phase shift distributor 208a divides the local signal into two signals with the 90-degree phase difference, and generates a cosine wave ($\cos(2\pi f_{LO} t)$) and a sine wave ($\sin(2\pi f_{LO} t)$).

The multiplier 202a multiplies the cosine wave ($\cos(2\pi f_{LO} t)$) and the output signal (Si) of the ADC 170a, and outputs the resultant signal (Sii) to the adder 213. The signal Sii is given by the following Expression (12).

[Expression 12]

$$Sii = 0.5\{\cos(2\pi(f_{vco}/N - f_{xo} - f_{LO})t) + \cos(2\pi(f_{vco}/N - f_{xo} + f_{LO})t)\} \quad (12)$$

The multiplier 204a multiplies the sine wave ($\sin(2\pi f_{LO})$) and the output signal (Si) of the ADC 170a, and outputs the resultant signal (Siq) to the subtractor 216. The signal Siq is given by the following Expression (13).

[Expression 13]

$$Siq = 0.5\{-\sin(2\pi(f_{vco}/N - f_{xo} - f_{LO})t) + \sin(2\pi(f_{vco}/N - f_{xo} + f_{LO})t)\} \quad (13)$$

The local oscillator 206b outputs the local signal whose frequency is $f_{LO}$ to the 90-degree phase shift distributor 208b. The 90-degree phase shift distributor 208b divides the local signal into two signals with the 90-degree phase difference, and generates a cosine wave ($\cos(2\pi f_{LO} t)$) and a sine wave ($\sin(2\pi f_{LO} t)$).

The multiplier 202b multiplies the cosine wave ($\cos(2\pi f_{LO} t)$) and the output signal (Sq) of the ADC 170b, and outputs the resultant signal (Sqi) to the subtractor 216. The signal Sqi is given by the following Expression (14).

[Expression 14]

$$Sqi = 0.5\{\sin(2\pi(f_{vco}/N - f_{xo} - f_{LO})t) + \sin(2\pi(f_{vco}/N - f_{xo} + f_{LO})t)\} \quad (14)$$

The multiplier 204b multiplies the sine wave ($\sin(2\pi f_{LO} t)$) and the output signal (Sq) of the ADC 170b, and outputs the resultant signal (Sqq) to the adder 213. The signal Sqq is given by the following Expression (15).

[Expression 15]

$$Sqq = 0.5\{\cos(2\pi(f_{vco}/N - f_{xo} - f_{LO})t) - \cos(2\pi(f_{vco}/N - f_{xo} + f_{LO})t)\} \quad (15)$$

The adder 213 adds the signals Sii and Sqq, and outputs the addition signal to the phase detector 212. The addition signal is given by the following Expression (16). Adding Sii and Sqq can cancel the unnecessary high-frequency component, and thus the low pass filter for removing the high-frequency component becomes unnecessary.

[Expression 16]

$$Sii + Sqq = \cos(2\pi(f_{vco}/N - f_{xo} - f_{LO})t) \quad (16)$$

The subtractor 216 subtracts the signal Siq from the signal Sqi, and outputs the difference signal to the phase detector 212. The difference signal is given by the following Expression (17). Subtracting Siq from Sqi can cancel the unnecessary high-frequency component, and thus the low pass filter for removing the high-frequency component becomes unnecessary.

[Expression 17]

$$Sqi - Siq = \sin(2\pi(f_{vco}/N - f_{xo} - f_{LO})t) \quad (17)$$

Here, Expression (16) corresponds to the inphase signal described in Embodiment 1 (Expression (5)), and Expression (17) corresponds to the quadrature signal described in Embodiment 1 (Expression (6)).

The operation after that, that is, the operations of the phase detector 212, frequency detector 214 and control voltage setting unit 130 are the same as those of Embodiment 1, and hence their description will be omitted.

The signal generating circuit of Embodiment 2 configured as described above can achieve the same effect as Embodiment 1 without using the LPF 210 and LPF 211. This enables the MCU 181 to cut the computing processing of the LPF 210 and LPF 211, thereby offering an advantage of being able to reduce the load of the computing processing of the MCU 181. In particular, when the order of the filters of the LPF 210 and LPF 211 must be raised, the computing processing for the signals grows larger, and so the reduction effect of the load increases.

Embodiment 3

The above-described Embodiment 1 shows a configuration which locates the quadrature demodulator 200 in the MCU 180. Embodiment 3 shows a configuration which removes the quadrature demodulator 200 from the MCU 180, and locates the quadrature demodulator 200 outside the MCU 180 as an analog circuit.

Figure 9:
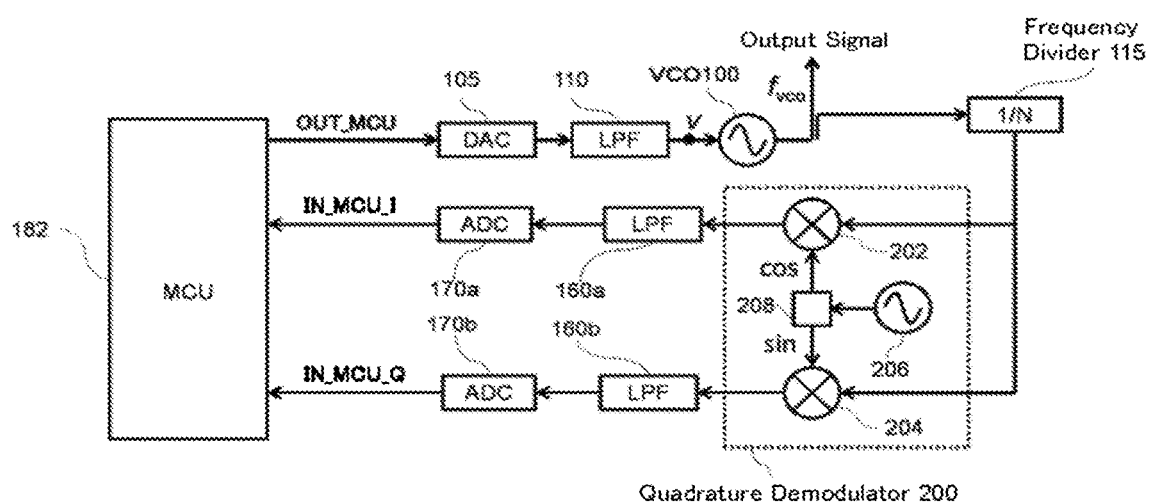
FIG. 9 is a block diagram showing a configuration of a signal generating circuit of an embodiment 3.

FIG. 9 is a block diagram showing a configuration of the signal generating circuit of Embodiment 3.

Incidentally, in FIG. 9, the same reference numerals as those of FIG. 1 designate the same or like components, and their description will be omitted. In FIG. 9, IN_MCU_I designates the inphase signal input to the MCU 182, IN_MCU_Q designates the quadrature signal input to the MCU 182, and OUT_MCU designates the signal output from the MCU 182.

As compared with the configuration of Embodiment 1, the signal generating circuit of Embodiment 3 differs in that it comprises a quadrature demodulator 200 instead of the multiplier 140 and local oscillator 150, an LPF 160a and an LPF 160b instead of the LPF 160, an ADC 170a and an ADC 170b instead of the ADC 170, and the MCU 182 instead of the MCU 180.

Figure 10:
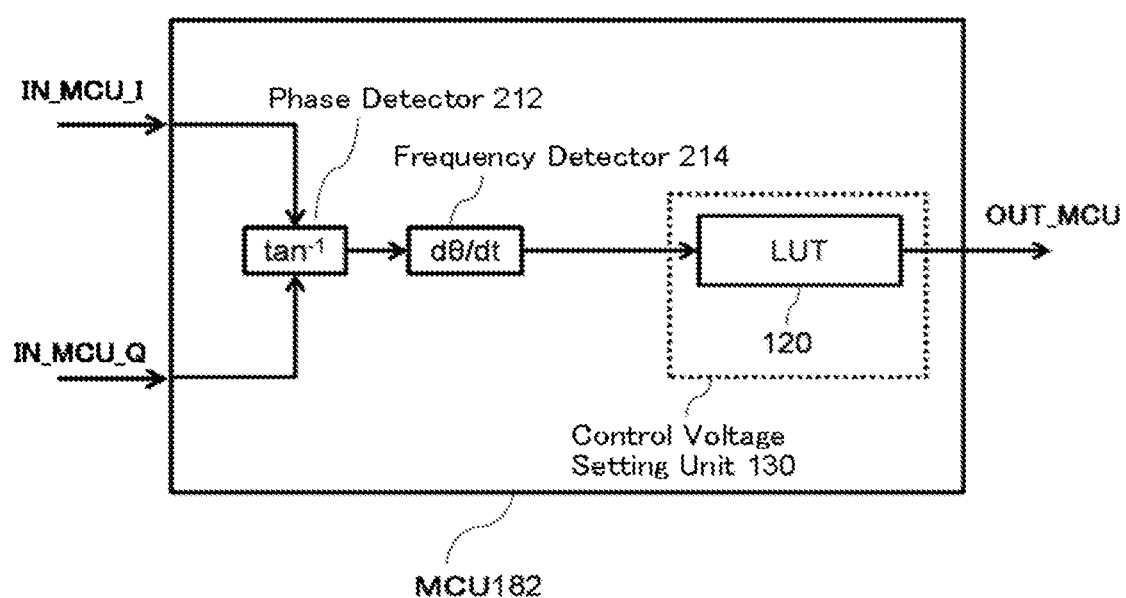
FIG. 10 is a block diagram showing a configuration of the MCU 182 of Embodiment 3.

FIG. 10 is a block diagram showing a configuration of the MCU 182 of the signal generating circuit of Embodiment 3.

As compared with MCU 180 of Embodiment 1, the MCU 182 of Embodiment 3 differs in that it does not comprise the quadrature demodulator 200.

Next, the operation of the signal generating circuit of Embodiment 3 will be described.

As for the operations of the DAC 105, LPF 110, VCO 100, and frequency divider 115, since they are the same as those of Embodiment 1, their description will be omitted.

The local oscillator 206 outputs the local signal whose frequency is $f_{LO}$ to the 90-degree phase shift distributor 208. The 90-degree phase shift distributor 208 divides the local signal into two signals with a phase difference of 90 degrees, and generates the cosine wave ($\cos(2\pi f_{LO}t)$) and sine wave ($\sin(2\pi f_{LO}t)$).

The multiplier 202 multiplies the cosine wave and the output signal of the frequency divider 115, and outputs the resultant signal to the LPF 160a as the inphase signal. The signal output from the multiplier 202 is given by the following Expression (18).

[Expression 18]

$$Si=0.5\{\cos(2\pi(f_{vco}/N-f_{LO})t)+\cos(2\pi(f_{vco}/N+f_{LO})t)\} \quad (18)$$

The multiplier 204 multiplies the sine wave and the output signal of the frequency divider 115, and outputs the resultant signal to the LPF 160b as the quadrature signal. The signal output from the multiplier 204 is given by the following Expression (19).

[Expression 19]

$$Sq=0.5\{-\sin(2\pi(f_{vco}/N-f_{LO})t)+\sin(2\pi(f_{vco}/N+f_{LO})t)\} \quad (19)$$

The LPF 160a removes the high-frequency component of the output signal of the multiplier 202. The signal whose high-frequency component is removed is given by the following Expression (20).

[Expression 20]

$$Si=\cos(2\pi(f_{vco}/N-f_{LO})t) \quad (20)$$

The LPF 160b removes the high-frequency component of the output signal of the multiplier 204. The signal whose high-frequency component is removed is given by the following Expression (21).

[Expression 21]

$$Sq=-\sin(2\pi(f_{vco}/N-f_{LO})t) \quad (21)$$

The ADC 170a converts the output signal of the LPF 160a (Expression (20)) from an analog signal into a digital signal, and outputs the digital signal to the phase detector 212 of the MCU 182. The ADC 170b converts the output signal of the LPF 160b (Expression (21)) from an analog signal into a digital signal, and outputs the digital signal to the phase detector 212 of the MCU 182.

As for the operations thereafter, that is, the operations of the phase detector 212, frequency detector 214 and control voltage setting unit 130, since they are the same as those of Embodiment 1, their description will be omitted.

The signal generating circuit of Embodiment 3 with the foregoing configuration achieves the same advantages as Embodiment 1. Furthermore, since the signal generating circuit of Embodiment 3 comprises the quadrature demodulator 200 as the analog circuit outside the MCU 182, it can carry out the quadrature demodulation at a speed higher than the configuration of carrying out the quadrature demodulation as the digital processing in the MCU. Thus, the present embodiment 3 can carry out the quadrature modulation and demodulation by the high-speed frequency-modulated signal. Furthermore, since the signal generating circuit of Embodiment 3 can obviate the necessity for the quadrature demodulator 200 in the MCU 180, it can reduce the load of the digital processing in the MCU 182.

Incidentally, although a configuration using the MCU 182 is shown here, it is also possible to use the MCU 181 instead of the MCU 182.

REFERENCE SIGNS LIST

100: VCO; 105 DAC; 110, 160, 160a, 160b, 210, 211: LPF; 115, 116: frequency divider; 120: LUT; 130: control voltage setting unit; 140, 140a, 140b, 202, 202a, 202b, 204, 204a, 204b: multiplier; 170, 170a, 170b: ADC; 180, 181, 182: MCU; 200, 200a, 200b: quadrature demodulator; 150, 206, 206a, 206b: local oscillator; 208, 208a, 208b: 90-degree phase shift distributor; 212: phase detector; 213: adder; 214: frequency detector; and 216: subtractor.

The invention claimed is:

1. A signal generating circuit comprising:
a control voltage setting circuit to set a control voltage by using voltage-frequency characteristics indicating characteristics of an output frequency versus voltage;
a voltage controlled oscillator to alter a frequency of an output signal in response to the control voltage;
a quadrature demodulator to carry out quadrature demodulation of part of the output signal of the voltage controlled oscillator using a local signal generated by a local oscillator, to generate an inphase signal and a quadrature signal which are orthogonal to each other; and
a frequency detector to detect the frequency of the output signal of the voltage controlled oscillator on a basis of the inphase signal and the quadrature signal, wherein
the control voltage setting circuit corrects the control voltage by using the voltage-frequency characteristics derived from relationships between the control voltage and the frequency of the output signal of the voltage controlled oscillator, and
the voltage controlled oscillator generates a chirp signal on a basis of the control voltage corrected by the control voltage setting circuit.

2. The signal generating circuit according to claim 1, further comprising a frequency divider to divide the frequency of the output signal of the voltage controlled oscillator, wherein the quadrature demodulator carries out quadrature demodulation of the output signal of the voltage controlled oscillator whose frequency is divided by the frequency divider.

3. The signal generating circuit according to claim 2, wherein the frequency divider outputs, as a frequency-divided signal, an inphase signal and a quadrature signal which are orthogonal to each other.

4. The signal generating circuit according to claim 1, further comprising:
   a frequency divider to divide the frequency of the output signal of the voltage controlled oscillator; and
   a frequency conversion circuit to alter a frequency of an output signal of the frequency divider, wherein
   the quadrature demodulator carries out quadrature demodulation of the output signal of the voltage controlled oscillator whose frequency is converted by the frequency conversion circuit.

5. The signal generating circuit according to claim 4, wherein the frequency divider outputs, as a frequency-divided signal, an inphase signal and a quadrature signal which are orthogonal to each other.

6. The signal generating circuit according to claim 1, further comprising a phase detector to detect a phase from the inphase signal and the quadrature signal, wherein
   the frequency detector detects the frequency of the output signal of the voltage controlled oscillator on a basis of the phase detected by the phase detector.

7. The signal generating circuit according to claim 6, wherein the phase detector detects the phase by dividing the quadrature signal by the inphase signal and calculating an arctangent of the division result.

8. The signal generating circuit according to claim 7, wherein the frequency detector detects the frequency of the output signal of the voltage controlled oscillator on a basis of the frequency obtained by calculating a time derivative of the phase detected by the phase detector.

9. The signal generating circuit according to claim 7, wherein the quadrature demodulator, the phase detector, the frequency detector, and the control voltage setting circuit are configured with a micro-controller.

10. The signal generating circuit according to claim 6, wherein the frequency detector detects the frequency of the output signal of the voltage controlled oscillator on a basis of the frequency obtained by calculating a time derivative of the phase detected by the phase detector.

11. The signal generating circuit according to claim 10, wherein the quadrature demodulator, the phase detector, the frequency detector, and the control voltage setting circuit are configured with a micro-controller.

12. The signal generating circuit according to claim 6, wherein the quadrature demodulator, the phase detector, the frequency detector, and the control voltage setting circuit are configured with a micro-controller.

13. The signal generating circuit according to claim 1, wherein the control voltage setting circuit includes a lookup table for storing the voltage-frequency characteristics of the voltage controlled oscillator, and sets the control voltage on a basis of the lookup table.

* * * * *